US012666996B2

(12) United States Patent
Goh et al.

(10) Patent No.: US 12,666,996 B2
(45) Date of Patent: Jun. 23, 2026

(54) PASSIVATION LAYER FOR AN INTEGRATED CIRCUIT DEVICE THAT PROVIDES A MOISTURE AND PROTON BARRIER

(71) Applicant: STMicroelectronics Pte Ltd, Singapore (SG)

(72) Inventors: Eng Hui Goh, Singapore (SG); Voon Cheng Ngwan, Singapore (SG); Fadhillawati Tahir, Singapore (SG); Ditto Adnan, Singapore (SG); Boon Kiat Tung, Singapore (SG); Maurizio Gabriele Castorina, Singapore (SG)

(73) Assignee: STMicroelectronics Pte Ltd, Singapore (SG)

( * ) Notice: Subject to any disclaimer, the term of this patent is extended or adjusted under 35 U.S.C. 154(b) by 373 days.

(21) Appl. No.: 18/538,935

(22) Filed: Dec. 13, 2023

(65) Prior Publication Data

US 2024/0404905 A1     Dec. 5, 2024

Related U.S. Application Data

(62) Division of application No. 17/518,215, filed on Nov. 3, 2021, now abandoned.
(Continued)

(51) Int. Cl.
H10W 74/10          (2026.01)
H10D 84/80          (2025.01)
(Continued)

(52) U.S. Cl.
CPC ........ H10W 74/137 (2026.01); H10D 84/811 (2025.01); H10P 14/6336 (2026.01); H10W 74/147 (2026.01)

(58) Field of Classification Search
CPC . H10W 74/137; H10W 74/147; H10W 74/43; H10D 84/811; H10P 14/6336
See application file for complete search history.

(56) References Cited

U.S. PATENT DOCUMENTS 3,730,766 A     5/1973   Nishimatsu et al.
5,698,894 A     12/1997  Bryant et al.
(Continued)

FOREIGN PATENT DOCUMENTS

CN     106803515 A    6/2017
CN     109256375 A    1/2019
(Continued)

OTHER PUBLICATIONS

Fanciulli, M., et al.: "EPR and UV-Raman study of BPSG thin films: structure and Defects," Microelectronic Engineer 55, 65-71, 2001.
(Continued)

*Primary Examiner* — Herve-Louis Y Assouman
(74) *Attorney, Agent, or Firm* — Crowe & Dunlevy LLC

(57)          ABSTRACT

An integrated circuit device includes a metal contact and a passivation layer extending on a sidewall of the metal contact and on first and second surface portions of a top surface of the metal contact. The passivation layer is format by a stack of layers including: a tetraethyl orthosilicate (TEOS) layer; a Phosphorus doped TEOS (PTEOS) layer on top of the TEOS layer; and a Silicon-rich Nitride layer on top of the PTEOS layer. The TEOS and PTEOS layers extend over the first surface portion, but not the second surface portion, of the top surface of the metal contact. The Silicon-rich Nitride layer extends over both the first and second surface portions, and is in contact with the second surface portion.

21 Claims, 6 Drawing Sheets

Related U.S. Application Data

(60) Provisional application No. 63/126,096, filed on Dec. 16, 2020.

(51) Int. Cl.

| | |
|---|---|
| *H10P 14/60* | (2026.01) |
| *H10W 74/43* | (2026.01) |

(56) References Cited

U.S. PATENT DOCUMENTS

| | | | |
|---|---|---|---|
| 5,990,513 | A | 11/1999 | Peerino et al. |
| 6,358,830 | B1 | 3/2002 | Morozumi |
| 8,884,405 | B2 | 11/2014 | Chuang et al. |
| 9,230,909 | B2 | 1/2016 | Ichinose et al. |
| 9,257,333 | B2 | 2/2016 | Lu et al. |
| 9,793,230 | B1 | 10/2017 | Yu et al. |
| 10,002,957 | B2 | 6/2018 | Koudymov |
| 10,128,193 | B2 | 11/2018 | Chen et al. |
| 10,312,207 | B2 | 6/2019 | Chang et al. |
| 10,332,817 | B1 | 6/2019 | Hardiman et al. |
| 2001/0028100 | A1 | 10/2001 | Schmitz et al. |
| 2004/0137681 | A1 | 7/2004 | Motoyoshi |
| 2010/0295044 | A1 | 11/2010 | Homma et al. |
| 2014/0299887 | A1* | 10/2014 | Matocha ............... H10W 76/48 |
| | | | 257/77 |

| | | | |
|---|---|---|---|
| 2015/0255362 | A1* | 9/2015 | Konrath .............. H10W 74/137 |
| | | | 257/272 |
| 2017/0287868 | A1 | 10/2017 | Isozaki et al. |
| 2018/0269169 | A1 | 9/2018 | Morita et al. |
| 2019/0064675 | A1 | 2/2019 | Yu et al. |
| 2019/0326255 | A1 | 10/2019 | Olson et al. |
| 2019/0363064 | A1 | 11/2019 | Lu |
| 2020/0185314 | A1 | 6/2020 | Kim |

FOREIGN PATENT DOCUMENTS

| | | |
|---|---|---|
| JP | S57043432 A | 3/1982 |
| JP | H02110930 A | 4/1990 |
| JP | H05152546 A | 6/1993 |
| JP | 2003249498 A | 9/2003 |

OTHER PUBLICATIONS

Jacquemont, C., et al: "Hydrogen Proton Induced HTRB Reliability Degradation in Trench Power Devices," 2020 IEEE Electron Devices Technology and Manufacturing Conference Proceeding, 3 pages.
Warren, W. L., et al: "Electron and Hole Trapping in Doped Oxides," IEEE Transactions on Nuclear Science, vol. 42, No. 6, 1995, pp. 1731-1739.
First Office Action and Search Report for counterpart EP Appl. 21213157.7, report dated May 24, 2022, 8 pgs.

* cited by examiner

PASSIVATION LAYER FOR AN INTEGRATED CIRCUIT DEVICE THAT PROVIDES A MOISTURE AND PROTON BARRIER

CROSS-REFERENCE TO RELATED APPLICATIONS

This application is a divisional of United States Application for patent Ser. No. 17/518,215, filed Nov. 3, 2021, which claims priority from United States Provisional Application for Patent No. 63/126,096, filed Dec. 16, 2020, the disclosures of which are incorporated herein by reference.

TECHNICAL FIELD

The present invention generally relates to integrated circuit devices and, in particular, to a passivation layer for such an integrated circuit device that provides a barrier against a contaminant, such as moisture and proton, intrusion.

BACKGROUND

Reference is made to FIG. 1 which shows a cross-section of a portion of an integrated circuit device 10. The illustrated device in this embodiment is a discrete power transistor of, for example, a vertical gate n-channel MOSFET type.

A semiconductor substrate 12 is lightly doped with a first-type dopant (for example, N-type). The semiconductor substrate 12 includes a top surface 14 and a bottom surface 16. A peripheral edge surface 18 of the semiconductor substrate 12 joins the top surface 14 and bottom surface 16. The semiconductor substrate 12 forms the drain region of the discrete power transistor. A metal layer 58 at the bottom surface 16 provides the drain (D) electrical contact. The metal layer 58 may, for example, be made of a stack of layers including: a Titanium (Ti) layer; a Nickel (Ni) or alloy of Nickel and Vanadium (NiV) layer; and a Silver (Ag) or Gold (Au) layer.

A plurality of trenches 20 extend into the semiconductor substrate 12 from the top surface 14. The trenches 20 have a depth which is less than a thickness of the semiconductor substrate 12. In an embodiment, each trench 20 has a width (extending in the plane of the cross-section) and a length (extending perpendicular to the width and in a plane into and out of the cross-section). In an embodiment, the length is substantially greater than the width, and thus each trench 20 is a strip trench extending into and out of the cross-section and having a rectangular shape in top view. Each trench 20 is lined by an insulating liner 22, with the remainder of each trench filled by an electrical conductor 24 forming the gate electrode of the discrete power transistor. In an embodiment, the insulating liner 22 is made of a dielectric material, for example an oxide, and the electrical conductor 24 is made of a conducting material, for example polysilicon (that may, if desired, be doped with a suitable dopant species/type).

The semiconductor substrate 12 further includes a first semiconductor well 26 that is doped with a second-type dopant (for example, P-type). The first semiconductor well 26 has a depth extending from the top surface 14 which is less than the depth of the trenches 20. The first semiconductor well 26 forms the body (channel) region of the discrete power transistor.

The peripheral termination region PR at the perimeter of the semiconductor substrate 12 includes a second semiconductor well 27 that is doped with the second-type dopant (for example, P-type). The second semiconductor well 27 has a depth extending from the top surface 14 which is greater than the depth of the trenches 20. The second semiconductor well 27 forms the ring region of the discrete power transistor.

The semiconductor substrate 12 further includes a semiconductor region 28 that is doped with the first-type dopant. The semiconductor region 28 has a depth extending from the top surface 14 which is less than the depth of the semiconductor well 26. The semiconductor region 28 forms the source region of the discrete power transistor. The semiconductor region 28 does not extend across the entire top surface 14 of the semiconductor substrate 12, but rather is present only in an active region AR corresponding generally to the area where the trenches 20 are present.

A field oxide region 30 is provided at the top surface 14 of the semiconductor substrate 12 in the peripheral region PR outside of the active region AR and adjacent the peripheral edge surface 18. This field oxide region 30 may, for example, surround the active region AR.

A premetallization dielectric layer 32 is deposited to cover the top surface 14 of the semiconductor substrate 12 and the oxide region 30. The premetallization dielectric layer 32 may be made of a dielectric material such as, for example, tetraethyl orthosilicate (tetraethoxysilane—TEOS). In an embodiment, the premetallization dielectric layer 32 may comprise a stack of layers including a TEOS layer covering the top surface 14 of the semiconductor substrate 12 and the oxide region 30 and a Boron and Phosphorus doped TEOS (BPTEOS) layer covering the TEOS layer. In another embodiment, the premetallization dielectric layer 32 may comprise a stack of layers including a TEOS layer covering the top surface 14 of the semiconductor substrate 12 and the oxide region 30 and a Phosphorus doped TEOS (PTEOS) layer covering the TEOS layer.

A plurality of trenches 34 extend through the premetallization dielectric layer 32 and into the semiconductor substrate 12. The trenches 34 have a depth which is less than the depth of the semiconductor well 26 and greater than the depth of the semiconductor region 28. Thus, the trenches 34 extend fully through the premetallization dielectric layer 32 and the semiconductor region 28 and partially into the semiconductor well 26. In an embodiment, each trench 34 has a width (extending in the plane of the cross-section) and a length (extending perpendicular to the width and extending in a plane into and out of the cross-section). In an embodiment, the length is substantially greater than the width, and thus each trench 34 is a strip trench extending into and out of the cross-section and having a rectangular shape in top view. Each trench 34 is located between (and extends parallel to) two trenches 20. The upper surface of the premetallization dielectric layer 32 and the sidewalls and bottom of each trench 34 are lined with a stack of layers 36 comprising, for example, a thin metal layer and a thin metal nitride layer. The thin metal layer may, for example, be made of Titanium, and the thin metal nitride layer may, for example, be made of a Titanium Nitride (TiN) material. The remainder of each trench 34 filled by an electrical conductor 38 forming the source and body contact of the discrete power transistor. The electrical conductor 38 may, for example, be made of a Tungsten (W) material.

A first metal layer 42 is deposited over the thin metal nitride layer 36. This first metal layer 42 may, for example, be made of Titanium (Ti).

A second metal layer 44 is deposited over the first metal layer 42. The second metal layer 44 may, for example, be made of Aluminum (Al) or an alloy of Copper and Aluminum (AlCu).

The second metal layer 44, first metal layer 42 and the metal/metal nitride layer stack 36 are lithographically patterned to define a source(S) electrical contact 46 and a gate (G) electrical contact 48.

The lithographic patterning exposes an upper surface of the premetallization dielectric layer 32 in areas where the source(S) electrical contact 46 and gate (G) electrical contact 48 are not present. A passivation layer 50 is deposited over the source (S) electrical contact 46, the gate (G) electrical contact 48 and the exposed upper surface of the premetallization dielectric layer 32. Detail of the passivation layer 50 configuration at the source (S) electrical contact 46 and gate (G) electrical contact 48 is shown in FIG. 2. In an embodiment, the passivation layer 50 may comprise a TEOS layer 50a, or a Silicon Nitride (SiN) layer 50b, or a stack of layers including the TEOS layer 50a and the Silicon Nitride (SiN) layer 50b. The TEOS layer 50a may, for example, have a thickness of about 10,000 Å and the SiN layer 50b may, for example, have a thickness of about 10,000 Å. The passivation layer 50 is lithographically patterned to form openings exposing an upper surface of the source(S) electrical contact 46 and gate (G) electrical contact 48.

The passivation layer 50 is provided to inhibit a contaminant (such as moisture and proton) intrusion. However, stress can cause cracks to form in the passivation layer 50. Contaminants can enter through the cracks and contribute to device failure. For example, moisture penetration can lead to temperature humidity bias (THB) reliability failure and proton intrusion can cause high temperature reverse bias (HTRB) reliability failure.

There is a need in the art for a passivation layer that can provide for an improved barrier against a contaminant, such as moisture and proton, intrusion.

SUMMARY

In an embodiment, an integrated circuit device comprises: a metal contact having a top surface and a sidewall, the top surface of the metal contact including a first surface portion, a second surface portion and a third surface portion; and a passivation layer extending on the sidewall of the metal contact and on the first and second surface portions of the top surface of the metal contact.

The passivation layer comprises a stack of layers including: a tetraethyl orthosilicate (TEOS) layer; a Phosphorus doped TEOS (PTEOS) layer on top of the TEOS layer; and a high-density Silicon-rich Nitride layer on top of the PTEOS layer.

The TEOS and PTEOS layers extend over the first surface portion of the top surface of the metal contact, but not over the second and third surface portions of the top surface of the metal contact.

The high-density Silicon-rich Nitride layer extends over the first and second surface portions of the top surface of the metal contact, but not over the third surface portion of the top surface of the metal contact.

BRIEF DESCRIPTION OF THE DRAWINGS

For a better understanding of the embodiments, reference will now be made by way of example only to the accompanying figures in which.

DETAILED DESCRIPTION

Figure 1:
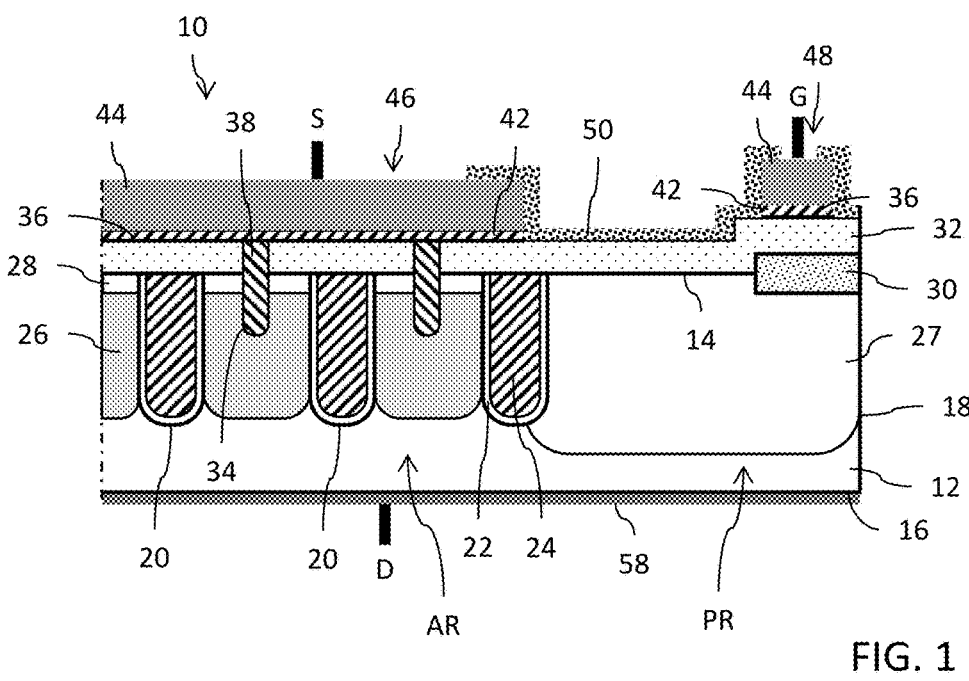
FIG. 1 shows a cross-section of a portion of an integrated circuit device.
Figure 2:
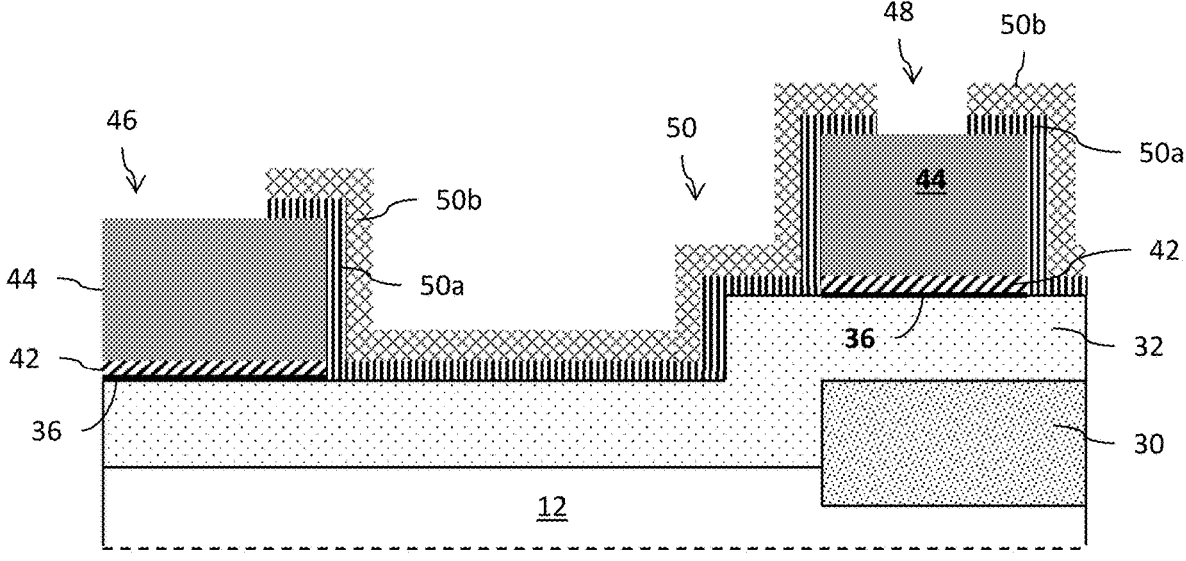
FIG. 2 shows detail of a passivation layer configuration at a source electrical contact and a gate electrical contact of the integrated circuit device of FIG. 1.
Figure 3:
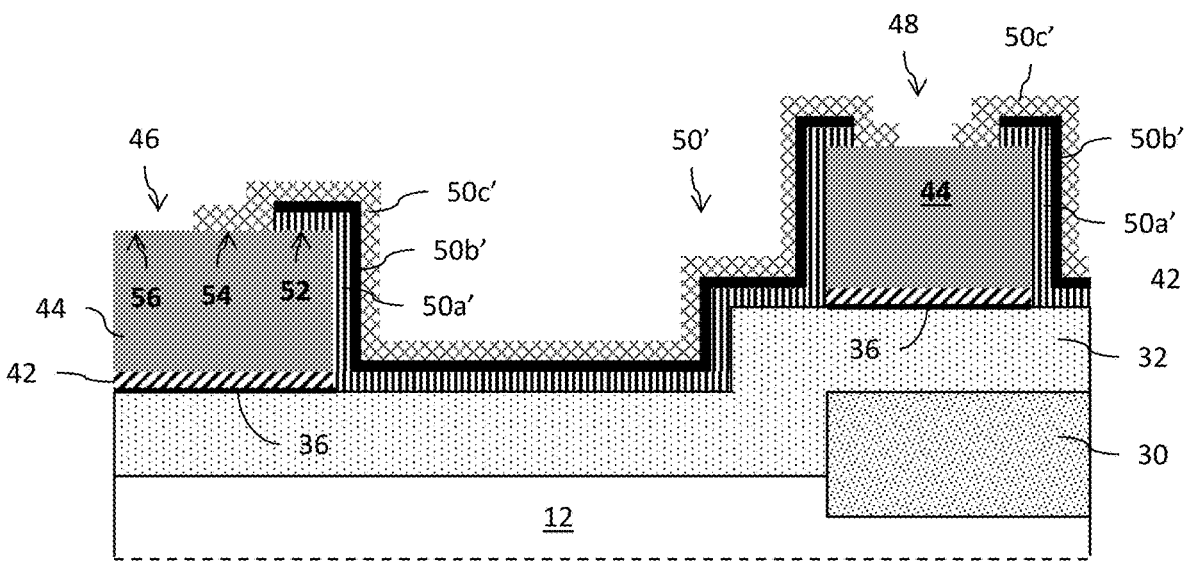
FIG. 3 shows detail of a passivation layer configuration at the source electrical contact and the gate electrical contact of the integrated circuit device of FIG. 1.
Figure 6:
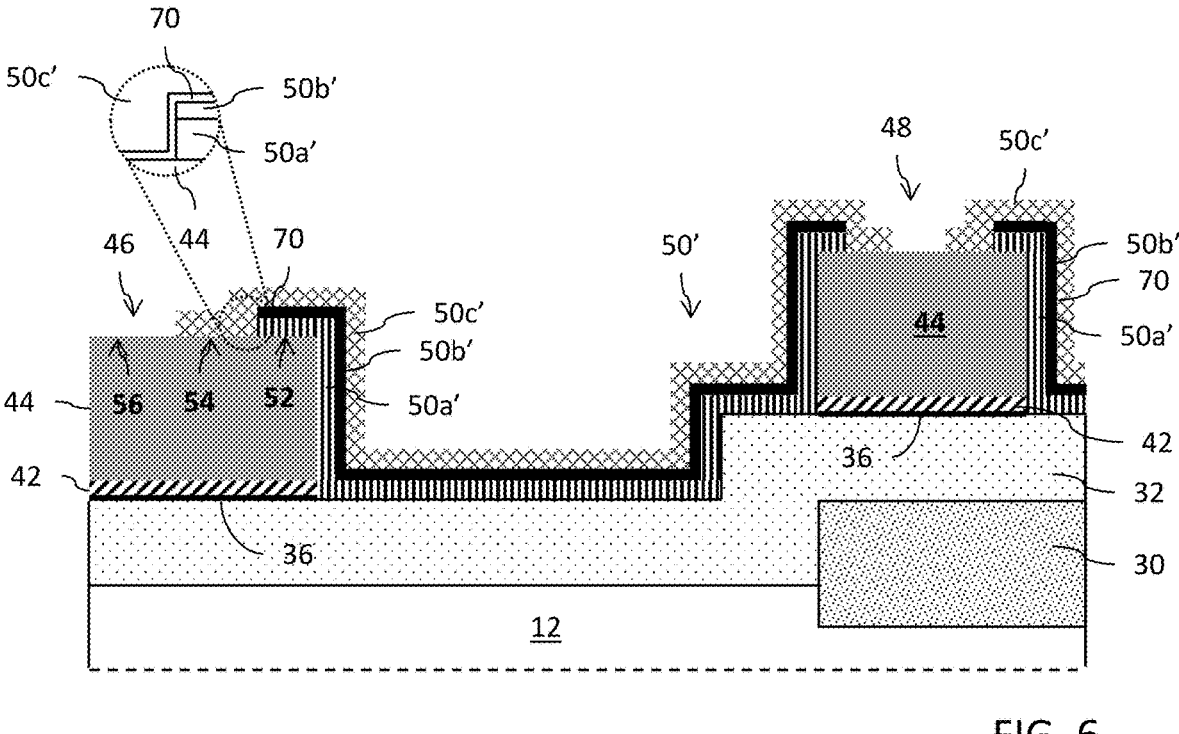
FIG. 6 shows detail of a passivation layer configuration at the source electrical contact and the gate electrical contact of the integrated circuit device of FIG. 1.

Reference is now made to FIGS. 3 and 6 which show detail of a passivation layer 50' configuration at the source electrical contact 46 and the gate electrical contact 48 of the integrated circuit device of FIG. 1. In this embodiment, the passivation layer 50' comprises a stack of layers including: a TEOS layer 50a', a Phosphorus doped TEOS (PTEOS) layer 50b' covering the TEOS layer 50a', and a Silicon Nitride (SiN) layer 50c'. The TEOS layer 50a' may, for example, have a thickness in a range of about 12,000-16,000 Å, the PTEOS layer 50b' may, for example, have a thickness in a range of about 4,000-6,000 Å, and the SiN layer 50c' may, for example, have a thickness in a range of about 8,000-12,000 Å. In the implementation as shown in FIG. 6, adhesion of the SiN layer 50c' on the metal layer 44 may be enhanced by the use of a thin Silicon flash layer 70 between the PTEOS layer 50b' and the SiN layer 50c'. The Silicon flash layer 70 may, for example, have a thickness of less than 100 Å. The passivation layer 50' is lithographically patterned to form openings exposing an upper surface of the source (S) electrical contact 46 and gate (G) electrical contact 48.

The TEOS layer 50a' provides a layer made of a material that is softer than Silicon Nitride to provide a stress relieving structure and also presents a good adhesion property with respect to the Aluminum material of the second metal layer 44. The TEOS layer 50a' also provides a diffusion barrier that inhibits the diffusion of Phosphorus from the PTEOS layer 50b'. The PTEOS layer 50b' functions as a gettering layer presenting a proton H+ gettering center. The SiN layer 50c' is preferably implemented as a high-density Silicon-rich Nitride (referred to in the art as a "Yellow Nitride") and functions as a moisture resistant barrier which inhibits penetration of contaminants such as proton H+ and moisture.

Figure 4:
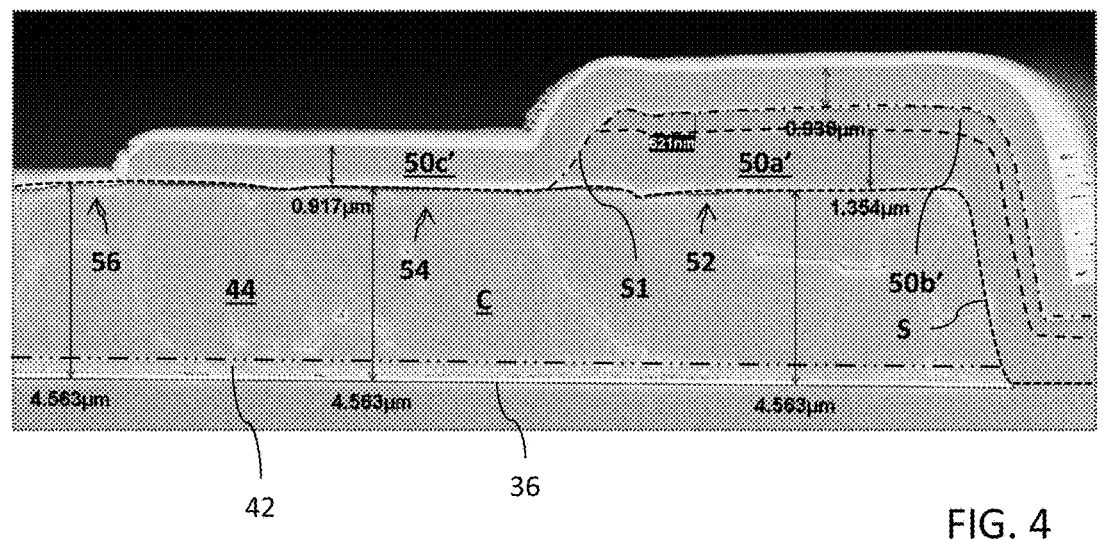
FIG. 4 shows a scanning electron micrograph of an example of the passivation layer configuration.

FIG. 4 shows a scanning electron micrograph of an example of the passivation layer 50' configuration relative to a contact (C) made of Aluminum.

All three layers 50a', 50b' and 50c' of the stack for the passivation layer 50' extend over the exposed upper surface of the premetallization dielectric layer 32 in areas where the source (S) electrical contact 46 and gate (G) electrical contact 48 are not present (see, right side). All three layers 50a', 50b' and 50c' of the stack for the passivation layer 50' further extend over sidewalls (S) of the contact C (i.e., on the side edge surfaces of the lithographically patterned layers 42 and 44). The three layers 50a', 50b' and 50c' of the stack for the passivation layer 50' further extend over a first surface portion 52 of the top surface of the contact C (i.e., on the top surface of the lithographically patterned layer 44). However, only the SiN layer 50c' extends over a second surface portion 54 of the top surface of the contact C. The SiN layer 50c' (along with flash layer 70, when present) extends on side edge surfaces of the layers 50a', 50b' at a transition from the first surface portion 52 to the second surface portion 54. A third surface portion 56 of the top surface of the contact C is not covered by any of the passivation layer 50'. Additionally, the SiN layer 50c' extends over sidewalls S1 of the layers 50a', 50b'.

Figures 5A, 5B, 5C, 5D, 5E:
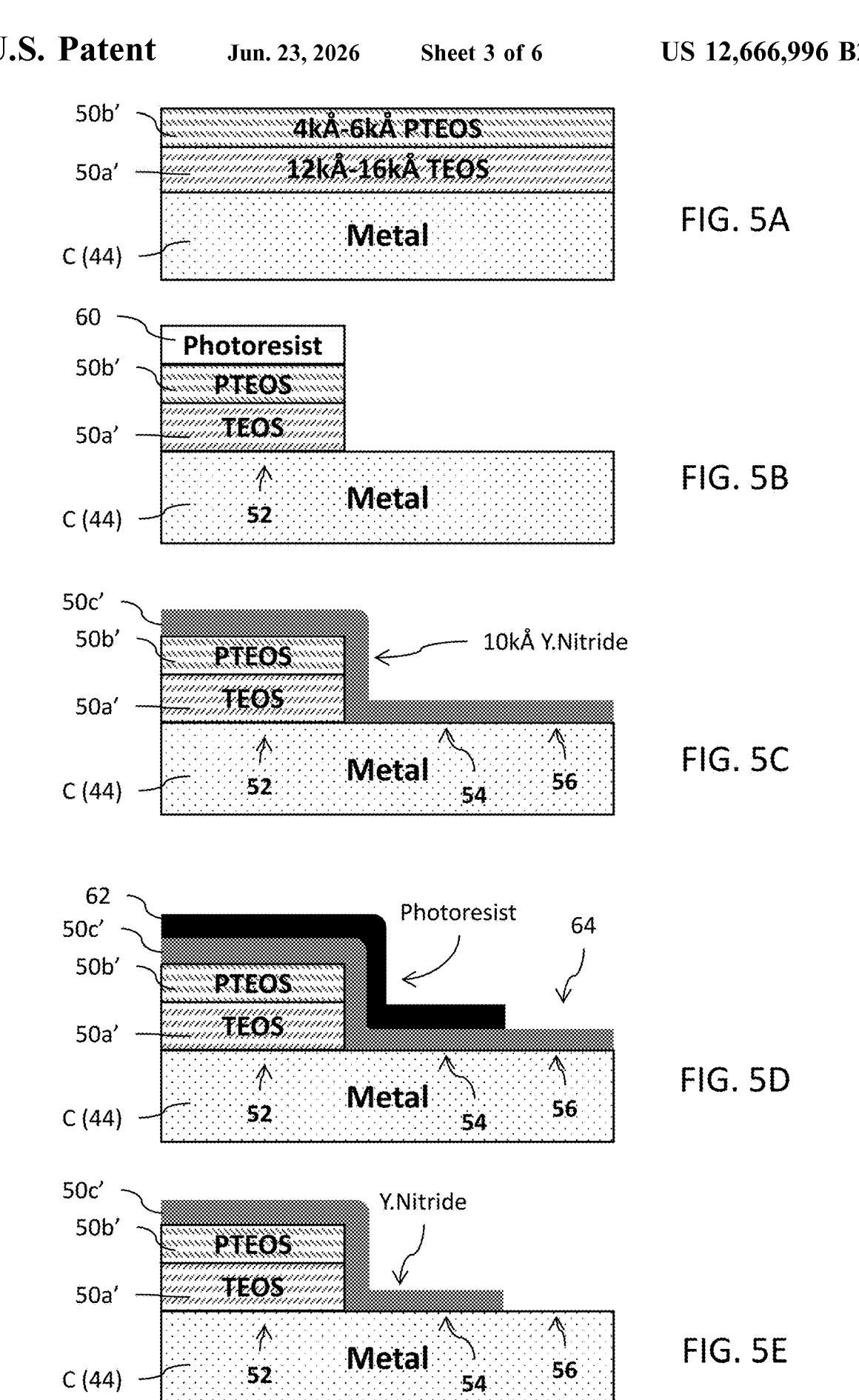
FIGS. 5A-5E show steps of a fabrication process for making the passivation layer configuration of FIGS. 3 and 4.
Figure 7:
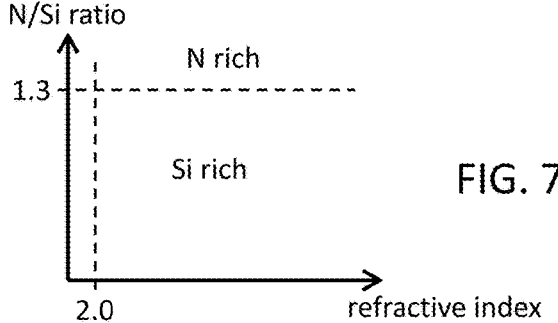
FIG. 7 illustrates a relationship between N/Si ratio and refractive index for Si-rich silicon nitride material.

Fabrication of the passivation layer 50' requires the use of two masks in lithographically patterning the three layers 50a', 50b' and 50c' (plus layer 70, if present) of the stack. The steps of the fabrication process are shown by FIGS. 5A-5E. In FIG. 5A, the layers 50a', 50b' are deposited over the metal contact C (44). The layers 50a' and 50b' may, for example, be deposited using plasma-enhanced chemical vapor deposition (PECVD). An advantage of using PECVD for deposition of layer 50b' is that the PECVD deposition process generates more dangling bonds that assist to getter the proton containment. In FIG. 5B, a first mask 60 is formed from a developed photoresist. The first mask 60 covers the first surface portion 52 of the top surface of the metal contact. An etch is then performed to remove portions of the layers 50a', 50b' which are not covered by the first mask 60. The first mask 60 is then removed. In FIG. 5C, the layer 50c' (with interposed Silicon flash layer 70, see FIG. 6, if desired) is conformally deposited to cover the patterned layers 50a', 50b' as well as the second and third surface portions 54 and 56 of the top surface of the metal contact. The layer 50c' and may, for example, be deposited using SiH$_4$-based plasma-enhanced chemical vapor deposition (PECVD). The stoichiometry of the SiN layer 50c' may, for example, comprise Si$_x$N$_y$ where the bond ratio x:y, for example, determinable by analysis techniques such as R-ray photoelectron spectroscopy (XPS), Fourier transform infrared spectroscopy (FTIS) or Rutherford backscattering (RBS) showing a N/Si ratio that is less than about 1.3 (or x:y greater than 3:4) and a refractive index, for example measured by the optical ellipsometry method, that is greater than 2 (see, FIG. 7). In FIG. 5D, a second mask 62 is formed from a developed photoresist. The second mask 62 covers the first and second surface portions 52 and 54 of the top surface of the metal contact. An etch is then performed to remove portions of the layer 50c' which is not covered by the second mask 62 so as to provide a contact opening 64 over the third surface portion 56 of the top surface of the metal contact. The second mask 62 is then removed. The result is shown in FIG. 5E.

Figure 8A:
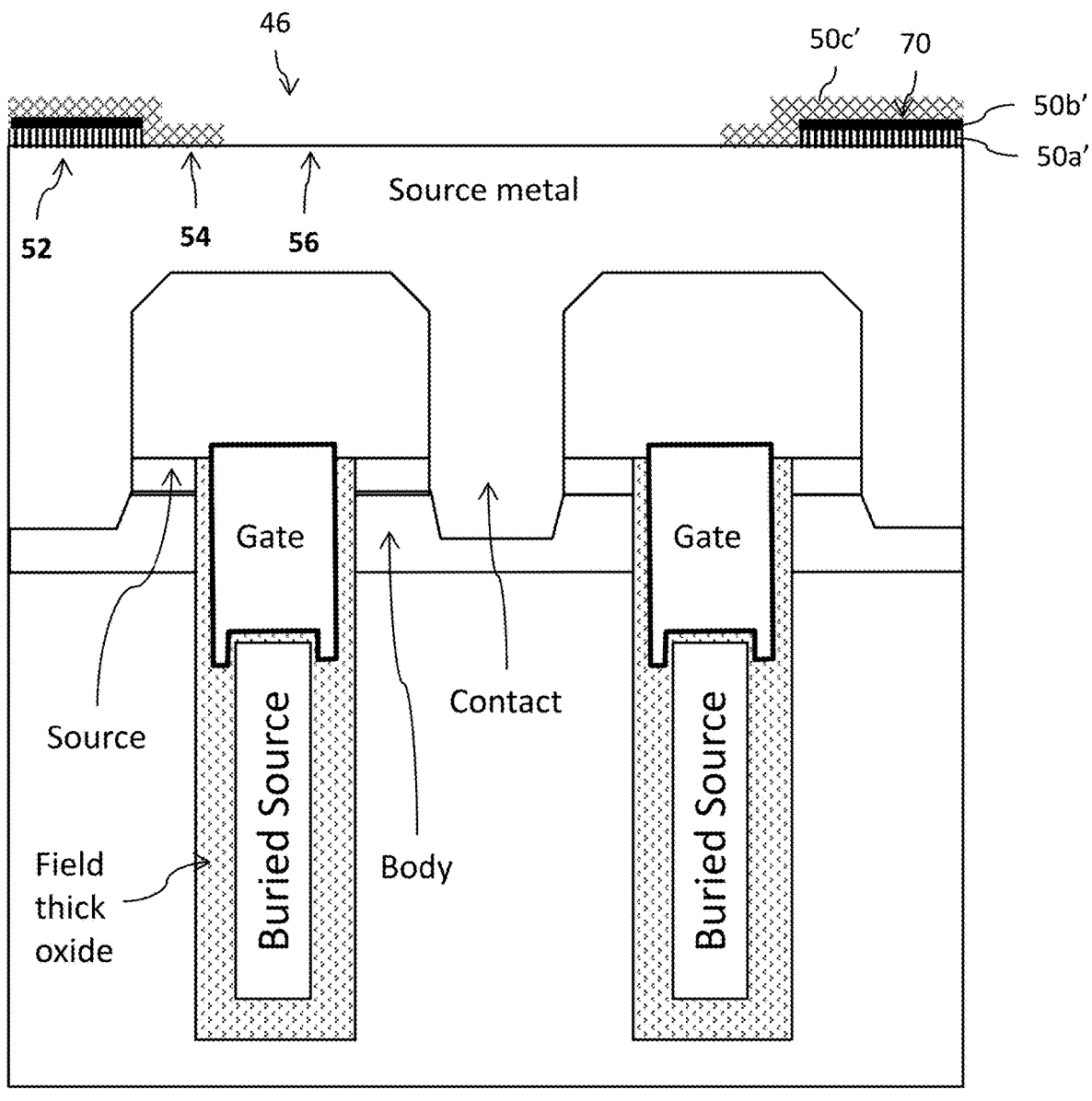
FIGS. 8A-8C show cross-sections of other integrated circuit devices utilizing the passivation layer configuration.
Figure 8B:
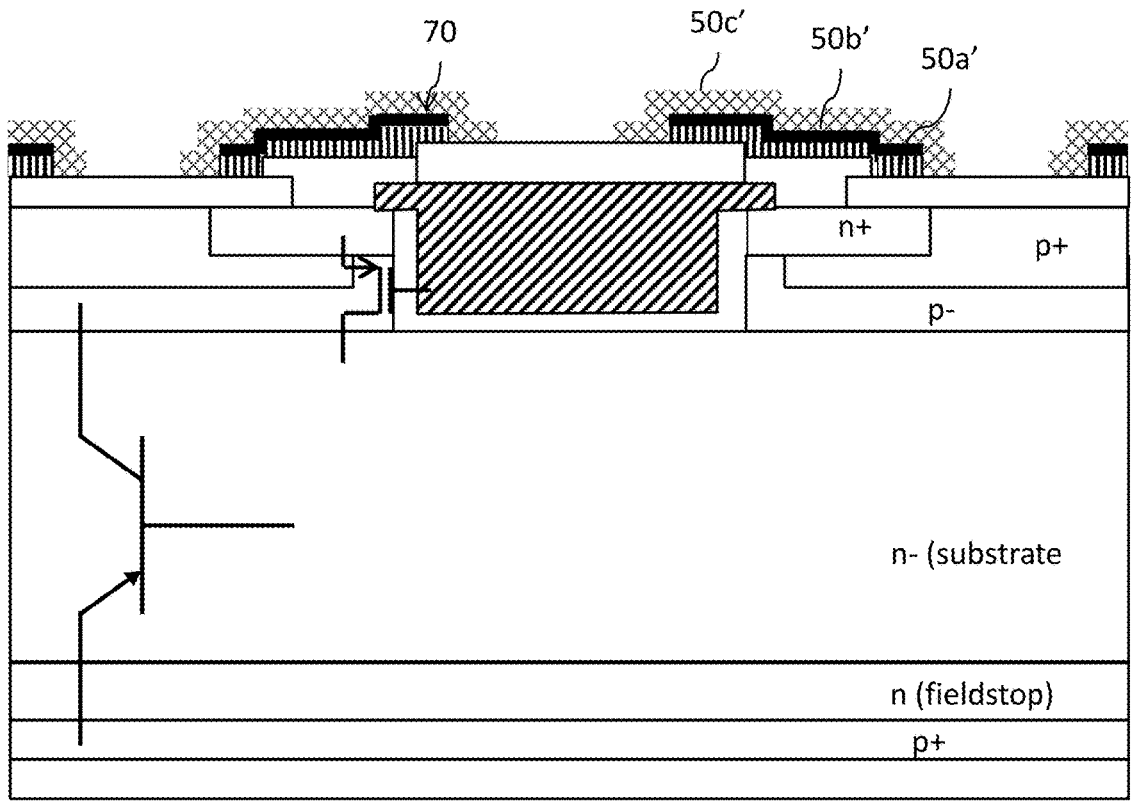
Figure 8C:
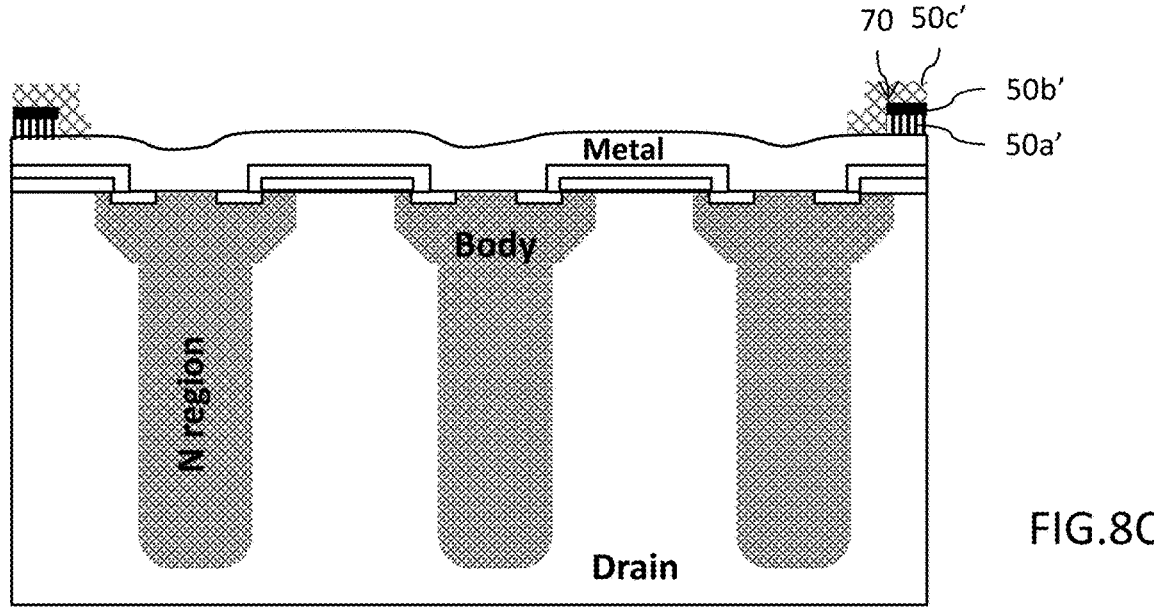

Although FIGS. 3 and 6 show use of the passivation layer 50' in connection with a power MOSFET transistor, it will be understood that the passivation layer 50' may be used in connection with the metal contact/bonding pad of any suitable integrated circuit device. Examples of such devices include, but are not limited to, a shielded gate trench power MOSFET (FIG. 8A) where the passivation is provided at a source and/or a gate contact, a trench gate field stop IGBT (FIG. 8B) where the passivation is provided at an emitter and/or gate contact, a superjunction MOSFET (FIG. 8C) where the passivation is provided at a source and/or gate contact, and a power diode where the passivation is provided at an anode and/or cathode contact.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. An integrated circuit device, comprising:
   a metal contact having a top surface, the top surface of the metal contact including a first surface portion, a second surface portion and a third surface portion; and
   a passivation layer extending on the first and second surface portions of the top surface of the metal contact;
   wherein the passivation layer comprises a stack of layers including:
      a tetraethyl orthosilicate (TEOS) layer;
      a Phosphorus doped TEOS (PTEOS) layer on top of the TEOS layer;
      a Silicon flash layer on top of the PTEOS layer; and
      a high-density Silicon-rich Nitride layer on top of the Silicon flash layer;
   wherein the TEOS and PTEOS layers extend over the first surface portion of the top surface of the metal contact, but not over the second and third surface portions of the top surface of the metal contact; and
   wherein the Silicon flash layer and the high-density Silicon-rich Nitride layer extend over the first and second surface portions of the top surface of the metal contact, but not over the third surface portion of the top surface of the metal contact.

2. The integrated circuit device of claim 1, wherein the Silicon flash layer enhances adhesion of the high-density Silicon-rich Nitride layer to the second surface portion of the top surface of the metal contact.

3. The integrated circuit device of claim 1, wherein the Silicon flash layer is in contact with side edge surfaces of the TEOS and PTEOS layers at a transition from the first surface portion to the second surface portion.

4. The integrated circuit device of claim 1, wherein the TEOS layer is in contact with the first surface portion of the top surface of the metal contact.

5. The integrated circuit device of claim 1, wherein the Silicon flash layer has a thickness of less than 100 Å.

6. The integrated circuit device of claim 1, wherein the Silicon flash layer is in contact with the second surface portion of the top surface of the metal contact, and the high-density Silicon-rich Nitride layer is in contact with the Silicon flash layer.

7. The integrated circuit device of claim 1, wherein the TEOS layer has a thickness in a range of about 12,000-16,000 Å, and the PTEOS layer has a thickness in a range of about 4,000-6,000 Å, and the high-density Silicon-rich Nitride layer has a thickness in a range of about 8,000-12,000 Å.

8. The integrated circuit device of claim 1, wherein the high-density Silicon-rich Nitride layer has a ratio of N/Si that is less than about 1.3 and the high-density Silicon-rich Nitride layer has a refractive index greater than 2.

9. The integrated circuit device of claim 1, wherein a stoichiometry of the high-density Silicon-rich Nitride layer comprises Si$_x$N$_y$ where x:y is greater than or equal to 3:4 and the high-density Silicon-rich Nitride layer has a refractive index greater than 2.

10. The integrated circuit device of claim 1, wherein the metal contact extends over a premetallization dielectric layer.

11. The integrated circuit device of claim 1, wherein the metal contact is one of a gate contact or a source contact of a transistor.

12. The integrated circuit device of claim 1, wherein the metal contact includes a sidewall, and wherein the passivation layer further extends on the sidewall of the metal contact.

13. The integrated circuit device of claim 1, wherein the metal contact is a contact for a transistor emitter or base terminal.

14. The integrated circuit device of claim 1, wherein the metal contact is a contact for an anode or cathode terminal of a diode.

15. The integrated circuit device of claim 1, wherein the PTEOS layer comprises a plasma enhanced chemical vapor deposition layer.

16. A method for making an integrated circuit device, comprising:

forming a metal contact having a top surface, the top surface of the metal contact including a first surface portion, a second surface portion and a third surface portion; and providing a passivation layer extending on the first and second surface portions of the top surface of the metal contact;

wherein providing the passivation layer comprises:

depositing a tetraethyl orthosilicate (TEOS) layer;

depositing a Phosphorus doped TEOS (PTEOS) layer on top of the TEOS layer;

patterning to remove portions of the PTEOS layer and the TEOS layer located over the second and third surface portions of the top surface of the metal contact;

depositing a Silicon flash layer on top of the PTEOS layer and the second and third surface portions of the metal contact;

depositing a high-density Silicon-rich Nitride layer on top of the Silicon flash layer; and patterning to remove portions of the Silicon-rich Nitride layer and the Silicon flash layer located over the third surface portion of the top surface of the metal contact.

17. The method of claim 16, wherein depositing the PTEOS layer comprises performing a plasma enhanced chemical vapor deposition process.

18. The method of claim 16, wherein the Silicon flash layer enhances adhesion of the high-density Silicon-rich Nitride layer to the second surface portion of the top surface of the metal contact.

19. The method of claim 16, wherein the Silicon flash layer is in contact with side edge surfaces of the TEOS and PTEOS layers at a transition from the first surface portion to the second surface portion.

20. The method of claim 16, wherein the high-density Silicon-rich Nitride layer has a ratio of N/Si that is less than about 1.3 and the high-density Silicon-rich Nitride layer has a refractive index greater than 2.

21. The method of claim 16, wherein a stoichiometry of the high-density Silicon-rich Nitride layer comprises $Si_xN_y$ where x:y is greater than or equal to 3:4 and the high-density Silicon-rich Nitride layer has a refractive index greater than 2.

\* \* \* \* \*